(12) United States Patent
Lei et al.

(10) Patent No.: US 9,479,041 B2
(45) Date of Patent: Oct. 25, 2016

(54) BOOTSTRAP DRIVING CIRCUIT WITHOUT EXTRA POWER SUPPLY

(71) Applicant: SHANGHAI RUKING ELECTRONICS CO., LTD, Shanghai (CN)

(72) Inventors: Huaigang Lei, Shanghai (CN); Xijun Yang, Shanghai (CN); Yuanqing Zhu, Shanghai (CN); Zhiling Liu, Shanghai (CN); Jun Zhu, Shanghai (CN)

(73) Assignee: SHANGHAI RUKING ELECTRONICS CO., LTD, Yangpu District, Shanghai (CN)

( * ) Notice: Subject to any disclaimer, the term of this patent is extended or adjusted under 35 U.S.C. 154(b) by 164 days.

(21) Appl. No.: 14/363,305

(22) PCT Filed: Dec. 5, 2012

(86) PCT No.: PCT/CN2012/085889
§ 371 (c)(1),
(2) Date: Jun. 6, 2014

(87) PCT Pub. No.: WO2013/083033
PCT Pub. Date: Jun. 13, 2013

(65) Prior Publication Data
US 2014/0361759 A1    Dec. 11, 2014

(30) Foreign Application Priority Data

Dec. 6, 2011   (CN) .......................... 2011 1 0401443

(51) Int. Cl.
| H02M 7/217 | (2006.01) |
| H02M 1/08 | (2006.01) |
| H03K 17/567 | (2006.01) |

(Continued)

(52) U.S. Cl.
CPC ............... H02M 1/08 (2013.01); H02M 7/217 (2013.01); H03K 17/567 (2013.01); H03K 17/6877 (2013.01); H02M 2001/0003 (2013.01); H03K 2217/0081 (2013.01)

(58) Field of Classification Search
CPC ................. H02M 1/08; H02M 7/217; H02M 2001/0003; H03K 17/567; H03K 17/6877; H03K 2217/0081
See application file for complete search history.

(56) References Cited

U.S. PATENT DOCUMENTS 5,956,243 A  *  9/1999  Mao ..................... H02M 1/4208
                                                   363/143
6,650,100 B1 * 11/2003  Kohout .................. G05F 1/613
                                                   323/282

(Continued)

*Primary Examiner* — Matthew Nguyen
(74) *Attorney, Agent, or Firm* — Global IP Service; Tianhua Gu

(57) ABSTRACT

The present invention provides a bootstrap driving circuit without extra power supply, which circuit includes a power unit, a switching unit, a bootstrap unit, a drive unit; the power unit is used to output a direct voltage; the switching unit is connected with the power unit, to control the turn-on or turn-off with the power unit; the bootstrap unit is connected with the switching unit, to supply drive electric energy and output drive power; the bootstrap unit includes an energy storage capacitor; the drive unit is connected with the bootstrap unit, to output control signal under the drive of the drive power. The bootstrap driving process is completed via the charging-discharging of the energy storage capacitor in the bootstrap unit of the invention and without an extra power supply, which forms the bootstrap driving circuit without extra power supply, further overcomes the requirement of an extra power supply for a common driving circuit, reduces the power consumption and meets the demand of the circuit. The invention is suitable for the application of a three-phase AC-DC converter to be drive controlled.

5 Claims, 3 Drawing Sheets

(51) Int. Cl.
*H03K 17/687* (2006.01)
*H02M 1/00* (2006.01)

(56) References Cited

U.S. PATENT DOCUMENTS 7,005,759 B2 * 2/2006 Ying .................. H02J 9/061
                                                    307/110

7,046,040 B2 * 5/2006 Guedon .................. H03F 3/217
                                                        326/88
2008/0224738 A1 * 9/2008 Bodano ................ H03K 5/1536
                                                            327/109
2011/0101929 A1 * 5/2011 Maedako ................ H02P 9/305
                                                            322/24
2015/0042298 A1 * 2/2015 Kung .................. H02M 3/1588
                                                            323/271

* cited by examiner

US 9,479,041 B2

BOOTSTRAP DRIVING CIRCUIT WITHOUT EXTRA POWER SUPPLY

CROSS REFERENCE TO RELATED PATENT APPLICATION

The present application is the US national stage of PCT/CN2012/085889 filed on Dec. 5, 2012, which claims the priorities of the Chinese patent applications No. 201110401443.8 filed on Dec. 6, 2011, which applications are incorporated herein by reference.

BACKGROUND OF THE PRESENT INVENTION

1. Field of Invention

The present invention belongs to the field of power electronic technology, and relates to a driving circuit, in particular to a bootstrap driving circuit without an extra power supply.

2. Description of Related Arts

With the development of the power electronic technology, a power level of a power electronic converter continually improves; driving energy of a power device continually increases as well. In principle, each controllable power switch requires its own isolated drive power, which results in the requirement of an isolated power supply. The isolated power supply includes a linear power supply and a switching power supply. The more the number of the isolated power supplies is, the greater difficulty the design of the isolated power supplies is, thereby causing the increase of cost and size, and even affecting the work efficiency of the system.

An existing bootstrap driving circuit, as shown in FIG. 1, includes a control chip, wherein a bootstrap diode is connected between a high-side switch driver output power supply terminal of the control chip and a power supply, a bootstrap capacitor is connected between the high-side switch driver output power supply terminal and a low-side switch driver output power supply terminal; the high-side switching pulse output end and the low-side switching pulse output end of the control chip is connected with a high-side switching MOS transistor and a low-side switching MOS transistor, respectively; the source electrode of the high-side switching MOS transistor and the drain electrode of the low-side switching MOS transistor are connected as a driving output end, which is further connected with the low-side switch driver output power supply terminal; an additional power supply circuit is connected between the source electrode of the high-side switching MOS transistor and the power supply terminal of the two switch driving output circuit.

From the existing bootstrap driving circuit, it is known that drive units of the conventional power device need an extra power supply, which results in insufficient application range, inflexible usage and high cost. With the expansion of the practical application, more and more power devices need the drive of the drive units, and conventional bootstrap driving circuit has been increasingly unable to meet the demand. Therefore, it is imperative for persons skilled in the art to design a bootstrap driving circuit with a simple structure, fully function and without an extra power supply.

SUMMARY OF THE PRESENT INVENTION

In view of the above disadvantages of the prior art, an object of the present invention is to provide a bootstrap driving circuit without an extra power supply, to measure the characteristics of wireless channels reasonably and accurately.

In order to achieve the above object and other related objects, the present invention provides a bootstrap driving circuit without an extra power supply.

A bootstrap driving circuit without an extra power supply, includes a power unit, a switching unit, a bootstrap unit, and a drive unit; the power unit is used to output a direct voltage; the switching unit is connected with the power unit, to control the turn-on or turn-off with the power unit; the bootstrap unit is connected with the switching unit, to supply drive electric energy and output drive power; the bootstrap unit includes an energy storage capacitor; the drive unit is connected with the bootstrap unit, to output a control signal under the drive of the drive power.

As a preferred embodiment of the present invention, the bootstrap unit includes an energy storage capacitor $C_3$, a voltage stabilizing diode $WD_1$, a diode $D_1$, wherein the energy storage capacitor $C_3$ is connected in series with the diode $D_1$, the voltage stabilizing diode $WD_1$ is connected in parallel with the energy storage capacitor $C_3$.

As another preferred embodiment of the present invention, the bootstrap unit further includes a resistor $R_4$, the resistor $R_4$ is connected in series between the diode $D_1$ and the energy storage capacitor $C_3$.

As another preferred embodiment of the present invention, the drive unit includes a photoelectric coupler, the photoelectric coupler includes a power side of a power device and a control side of a control device, the power side of the power device receives the drive of the drive power, the control side of the control device output the control signal.

As another preferred embodiment of the present invention, the switching unit includes a second bridge rectifier circuit and a power device; the second bridge rectifier circuit is connected in parallel with the power device; the gate pole of the power device is connected with the power side of the power device of the drive unit, to receive the drive power.

As another preferred embodiment of the present invention, the power unit includes an inductor $L_1$, a first bridge rectifier circuit, voltage stabilizing capacitors $C_1$, $C_2$; the inductor $L_1$ is connected with the first bridge rectifier circuit, the voltage stabilizing capacitors $C_1$, $C_2$ being in series is connected in parallel with the first bridge rectifier circuit; the first bridge rectifier circuit includes diodes $D_3$, $D_4$, $D_5$, $D_6$, wherein the diodes $D_3$ and $D_4$ are in series to form a first series circuit, the diodes $D_5$ and $D_5$ are in series to form a second series circuit; the first series circuit and the second series circuit are in parallel to form the first bridge rectifier circuit; a cathode end of the diode $D_3$ is a first output end of the power unit, a positive leading-out of the voltage stabilizing capacitor $C_2$ is a second output end of the power unit.

As another preferred embodiment of the present invention, the power unit includes inductors $L_1'$, $L_2'$, $L_3'$, a third bridge rectifier circuit, voltage stabilizing capacitors $C_1'$, $C_2'$; the third bridge rectifier circuit includes diodes $D_1'$, $D_2'$, $D_3'$, $D_4'$, $D_5'$, $D_6'$, wherein the diode $D_1'$ and the diode $D_4'$ are in series to form a first series circuit, the diode $D_2'$ and the diode $D_5'$ are in series to form a second series circuit, the diode $D_3'$ and the diode $D_6'$ are in series to form a third series circuit; the first series circuit, the second series circuit and the third series circuit are in parallel to form the third bridge rectifier circuit; the inductor $L_1'$ is connected with an anode of the diode $D'$, the inductor $L_2'$ is connected with an anode of the diode $D_2'$, the inductor $L_3'$ is connected with an anode of the diode $D_3'$; the voltage stabilizing capacitors $C_1'$, $C_2'$ being in series is connected in parallel with the third bridge rectifier circuit, an anode of the voltage stabilizing capacitor C1' is connected with a cathode of the diode D3', a negative pole of the voltage stabilizing capacitor C2' is connected with an anode of the diode D6'; an anode end of the diode D1' is a first output end of the power unit, an anode end of the diode D2' is a second output end of the power unit, an anode end of the diode D3' is a third output end of the power unit, a cathode end of the diode D1' is a fourth output end of the power unit, an anode end of the diode D4' is a fifth output end of the power unit, a positive leading-out of the voltage stabilizing capacitor C2' is a sixth output end of the power unit.

As described above, the bootstrap driving circuit without an extra power supply of the present invention has the following beneficial effects: the bootstrap driving process is completed via the charging-discharging of the energy storage capacitor in the bootstrap unit of the invention and without an extra power supply, which forms the bootstrap driving circuit without an extra power supply, further overcomes the requirement of an extra power supply for a common driving circuit, reduces the power consumption and meets the demand of the circuit. The invention is particularly suitable for the application of a three-phase AC-DC converter to be drive controlled in the power electronic field.

The instructions of the element mark 1 power unit; 2 switching unit; 3 bootstrap unit; 4 drive unit; 1' power unit; 2' switching bootstrap drive unit; 3' switching bootstrap drive unit; 4' switching bootstrap drive unit.

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to figures. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

The present invention discloses a bootstrap driving circuit without an extra power supply, which circuit includes a power unit, a switching unit, a bootstrap unit and a drive unit, the output end of the power unit is a direct voltage, and there is another leading-out terminal of the power unit connected with the switching unit. The output end of the switching unit is connected with the first and third output ends of the bootstrap unit; the output end of the bootstrap unit is connected with the input end of the power side of the drive unit. Wherein, the link of the power unit is the use of bridge typed uncontrollable rectifier circuit; the switch link can use a bridge circuit; the bootstrap unit can use a circuit for capacitive storage; the drive unit can use an optical coupler isolating circuit or a magnetic coupler isolating circuit. The bootstrap driving circuit without an extra power supply of the present invention reduces the demand of applying extra devices, and makes full use of the energy of the power unit, and has wide universality, simple structure and low cost.

Hereinafter, the specific embodiments of the present invention are described in further detail by combining with the drawings.

First Embodiment

Figure 1:
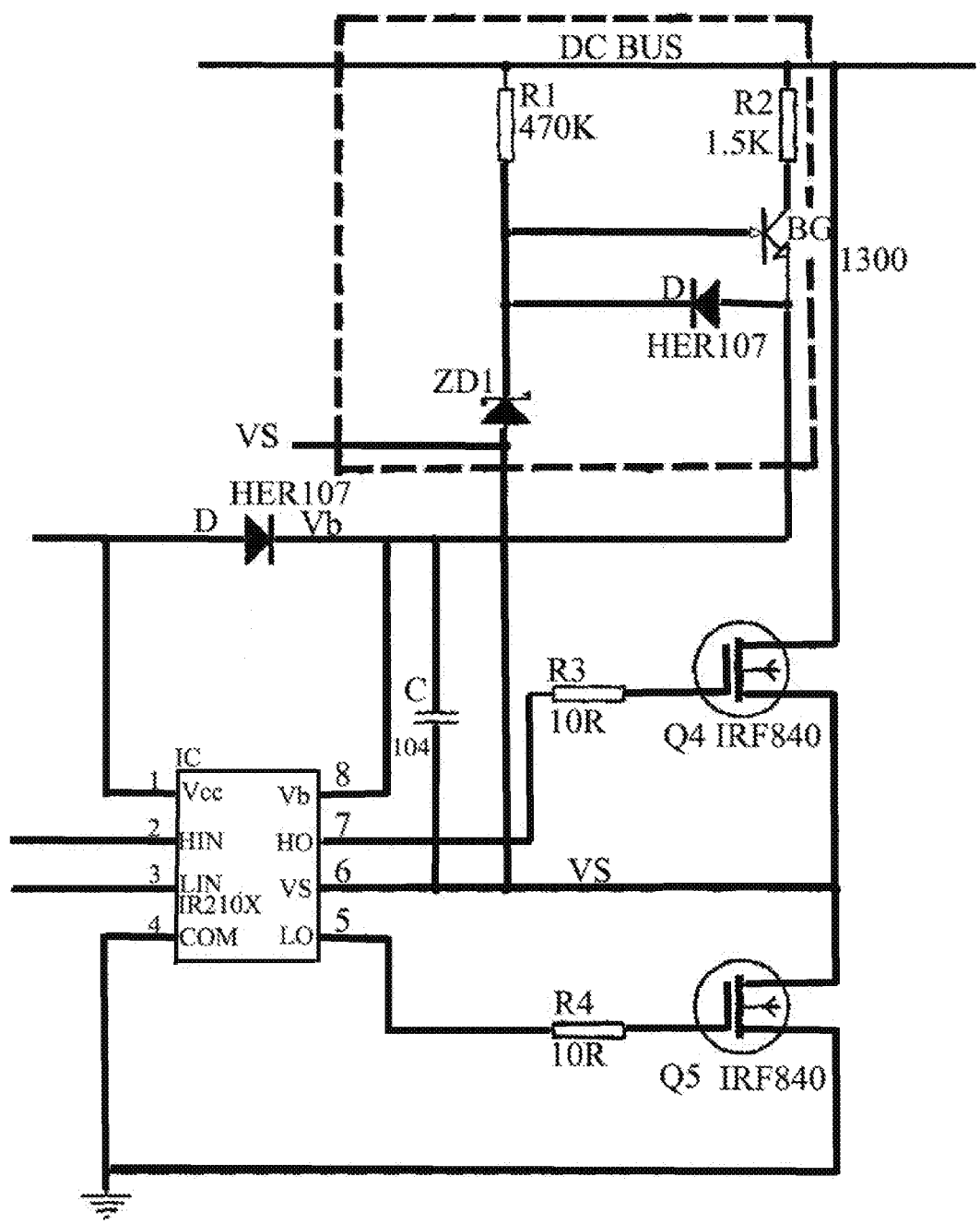
FIG. 1 is a circuit configuration diagram of an existing bootstrap driving circuit.
Figure 2:
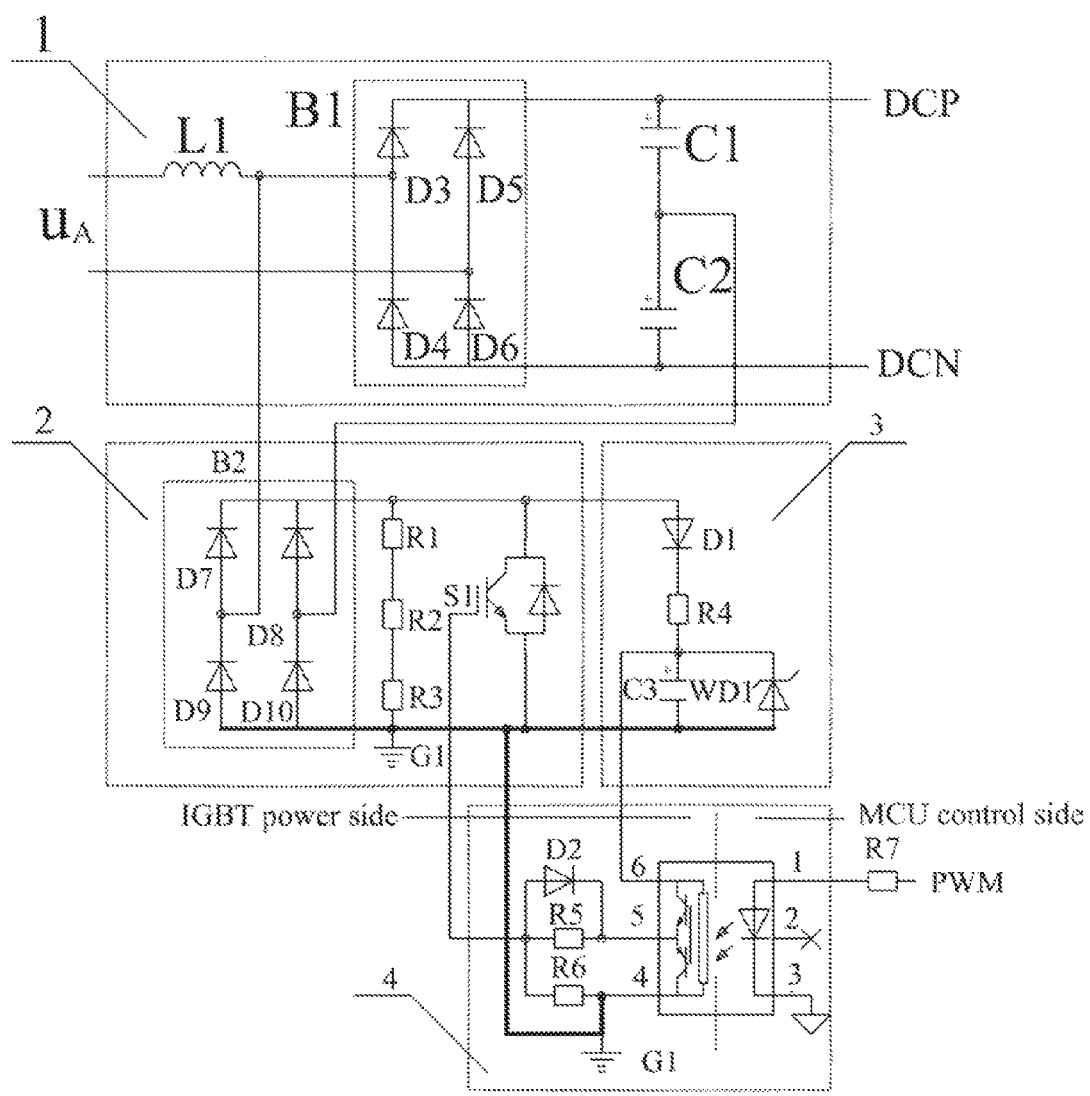
FIG. 2 is a circuit configuration diagram of a bootstrap driving circuit without an extra power supply for a single-phase power supply system of the first embodiment.

The embodiment provides a bootstrap driving circuit without an extra power supply, as shown in FIG. 2, including a power unit 1, a switching unit 2, a bootstrap unit 3, a drive unit 4; the power unit is used to output a direct voltage; the switching unit is connected with the power unit, to control the turn-on or turn-off with the power unit; the bootstrap unit is connected with the switching unit, to supply drive electric energy and output a drive signal; the bootstrap unit includes an energy storage capacitor; the drive unit is connected with the bootstrap unit, to output control signal under the drive of the drive power.

Hereinafter, each element will be described respectively:

[Bootstrap Unit]

The bootstrap unit 3 includes an energy storage capacitor C3, a voltage stabilizing diode WD1, a diode D1, wherein the energy storage capacitor C3 is connected in series with the diode D1, the voltage stabilizing diode WD1 is connected in parallel with the energy storage capacitor C3. The bootstrap unit 3 further includes a current-limiting resistor R4, which is connected in series between the current-limiting diode D1 and the energy storage capacitor C3, the voltage stabilizing diode WD1 is connected in parallel with the energy storage capacitor C3. The input end of the bootstrap unit receives the output signal of the switching unit.

The bootstrap unit is a circuit with the energy storage capacitor C3 as a core, the output end is connected with the input end of the drive unit.

The diode D1 may be a reverse fast recovery diode, with a reverse withstand voltage value of 800V.

The resistor R4 may be a plug-in resistor, with a resistance value of 1 kΩ.

The capacitor C3 may be an aluminum electrolytic capacitor, 22 µF/450V.

The voltage stabilizing diode WD1 may be a normal voltage stabilizing diode.

[Drive Unit]

The drive unit 4 includes a diode D2, resistors R5, R6, R7, and a photoelectric coupler OP1. The diode D2 is connected in parallel with the resistor R5, one end of the resistor R5 is connected with the fifth pin of the photoelectric coupler OP1, the other end of the resistor R5 is connected with the gate pole of the power device S1; the resistor R7 is connected with the first pin of the photoelectric coupler OP1;

one end of the resistor R4 is connected with the fourth pin of the photoelectric coupler OP1, the other end of the resistor R4 is connected with the gate pole of the power device S1. The photoelectric coupler OP1 includes a power side of the power device and a control side of the control device being photoelectric coupling connected. The power side of the power device receives the drive signal; the control side of the control device outputs the control signal. The sixth pin of the photoelectric coupler OP1 is connected with the positive pole of the capacitor C3 in the bootstrap unit. The power side of the power device receives the drive signal; the control side of the control device outputs the control signal.

The input end of the drive power of the drive unit (i.e., the sixth pin of the photoelectric coupler OP1) inputs drive power for driving the power device, the output end of the drive unit (i.e., the fifth pin of the photoelectric coupler OP1) is connected with the control terminal (i.e., the gate pole of the power device).

The diode D2 may be a normal diode.

The resistors R5, R6 may be chip resistors, with a resistance value of 100Ω.

The resistors R7 may be a chip resistor, with a resistance value of 1 kΩ.

The photoelectric coupler OP1 may be a low or high speed photoelectric coupler.

In the embodiment, the input AC voltage is 220V, and all components are high precision.

[Switching Unit]

The switching unit 2 includes a second bridge rectifier circuit B2, a power device S1, and protective resistors R1, R2, R3; the second bridge rectifier circuit is connected in parallel with the power device; the gate pole of the power device is connected with the power side of the power device of the drive unit, to receive the drive signal; the protective resistors R1, R2, R3 being in series is connected in parallel with the power device S1.

The second bridge rectifier circuit B2 is a bridge uncontrollable rectifier circuit. The bridge uncontrollable rectifier circuit may be a diode-type uncontrollable rectifier circuit with a packaging module.

The protective resistors R1, R2, R3 are plug-in resistors, with a resistance value of 1 kΩ, which is a high resistance.

The power device S1 may be an IGBT, the gate pole of the power device S1 receives drive signal.

[Power Unit]

The power unit 1 includes a boost inductor L1, a first bridge rectifier circuit B1, voltage stabilizing capacitors C1, C2; the boost inductor L1 is connected with the first bridge rectifier circuit, the voltage stabilizing capacitors C1, C2 being in series is connected in parallel with the first bridge rectifier circuit; the first bridge rectifier circuit includes diodes D3, D4, D5, D6, wherein the diodes D3 and D4 are in series to form a first series circuit, the diodes D5 and D6 are in series to form a second series circuit; the first series circuit and the second series circuit are in parallel to form the first bridge rectifier circuit; the cathode end of the diodes D3 and D5 is the first output end of the power unit, the anode end of the diodes D4 and D6 is the second output end of the power unit, the positive leading-out of the voltage stabilizing capacitor C2 is the third output end of the power unit.

The first bridge rectifier circuit B1 is a bridge uncontrollable rectifier circuit. The bridge uncontrollable rectifier circuit is a diode-type bridge rectifier circuit.

The inductor L1 may be amorphous material with a design of planar structure, and an inductance value of 750 pH.

The uncontrollable rectifier bridge (i.e., bridge uncontrollable rectifier circuit) may be a diode-type uncontrollable rectifier circuit with a packaging module.

The capacitors C1, C2 may be aluminum electrolytic capacitors, 2200 µF/450V.

The bootstrap driving process of the bootstrap driving circuit without an extra power supply of the present invention is completed via the charging-discharging of the energy storage capacitor in the bootstrap unit and without an extra power supply, which forms the bootstrap driving circuit without extra power supply, further overcomes the requirement of an extra power supply for a common driving circuit, reduces the power consumption and meets the demand of the circuit. The invention is suitable for various applications with requirement of drive controlled in the power electronic field.

The bootstrap driving circuit without an extra power supply of the present invention has the characteristics of a novel structure design and wide universality, and the advantages of a simple structure and low cost. Besides, it can achieve in the function of supplying the drive unit by utilizing the power of the main circuit and reducing the external demand for the use of the circuit through the invention, which further has advantages of convenience in application, simple structure, easy control and low cost. By employing the bootstrap driving circuit without an extra power supply of the present invention to generate a working power supply with isolation effect, it can feature effectively utilizing the energy of the power unit, convenience in use, subtly design and good application prospects.

The operating method of the bootstrap driving circuit without an extra power supply of the embodiment is described as follows:

Power frequency voltage outputs a DC voltage through the first rectifier bridge. Meanwhile, in positive half-cycle of the power frequency voltage, as the controller sends the power device turn-off signal, the drive unit terminal is in a status of low level signal and is unable to make the first photoelectric coupler work, the gate pole signal of the first power device is pulled down to zero through the sixth resistor, and the power device is turned off. Power unit current forms a circuit via a first boost inductor, the second uncontrollable rectifier bridge, the first diode, the fourth resistor, the third energy storage capacitor, the second uncontrollable rectifier bridge, the second capacitor, and the first uncontrollable rectifier bridge; the third energy storage capacitor stores energy as its voltage rises, and clamps voltage with the function of the first voltage stabilizing diode. As the controller sends the power device a ON signal, the drive unit terminal is in a status of high level signal, and enables the first photoelectric coupler to work through the seventh resistor, the third capacitor serves as a power supply to release energy, and the voltage herein pulls up the gate pole voltage of the first power device through the fifth resistor, and triggers its breakover; the other energy returns to the main circuit through the sixth resistor. Meanwhile, power unit current forms a circuit via the first boost inductor, the second uncontrollable rectifier bridge, a parallel branch formed of the first power device and a protective circuit consisting of the first resistor, the second resistor and the third resistor, the second uncontrollable rectifier bridge, the second capacitor, and the first uncontrollable rectifier bridge; the first diode has negative voltage at both ends, and is forced to turn-off. In negative half-cycle of the power frequency voltage, as the controller sends the power device turn-off signal, the drive unit terminal is low level signal and is unable to make the first photoelectric coupler work, the gate pole signal of the first power device is pulled down to zero through the sixth resistor, and the power device is off. Power unit current forms a circuit via the first uncontrollable rectifier bridge, the first capacitor, the second uncontrollable rectifier bridge, the first diode, the fourth resistor, the third energy storage capacitor, the second uncontrollable rectifier bridge and the first inductor; the third energy storage capacitor stores energy as its voltage rises, and clamps with the function of the first voltage stabilizing diode. As the controller sends the power device the ON signal, the drive unit terminal is high level signal, and is enable the first photoelectric coupler to work through the seventh resistor, the third capacitor serves as a power supply to release energy, and the voltage herein pulls up the gate pole voltage of the first power device through the fifth resistor, and triggers its breakover; the other energy returns to the main circuit through the sixth resistor. Meanwhile, power unit current forms a circuit via the first uncontrollable rectifier bridge, the first capacitor, the second uncontrollable rectifier bridge, the parallel branch of the first power device and a protective circuit consisting of the first resistor, the second resistor and the third resistor, the second uncontrollable rectifier bridge and the first boost inductor; the first diode has negative voltage at both ends, and is forced to turn-off.

Second Embodiment

The embodiment provides a bootstrap driving circuit without an extra power supply being applicable in a three-phase AC power supply system, i.e., a bootstrap driving circuit without an extra power supply of the three-phase partial active power factor correction circuit (PFC). Since in the three-phase partial active power factor correction circuit (PFC), it needs to use bilateral controllable switches, and each bilateral controllable switch requires an isolated drive power supply. If adopting a traditional approach, three isolated drive power supplies are required; while adopting the bootstrap driving circuit without an extra power supply of the first embodiment, it may achieve in omitting an extra power supply, saving hardware cost and increasing reliability.

Figure 3:
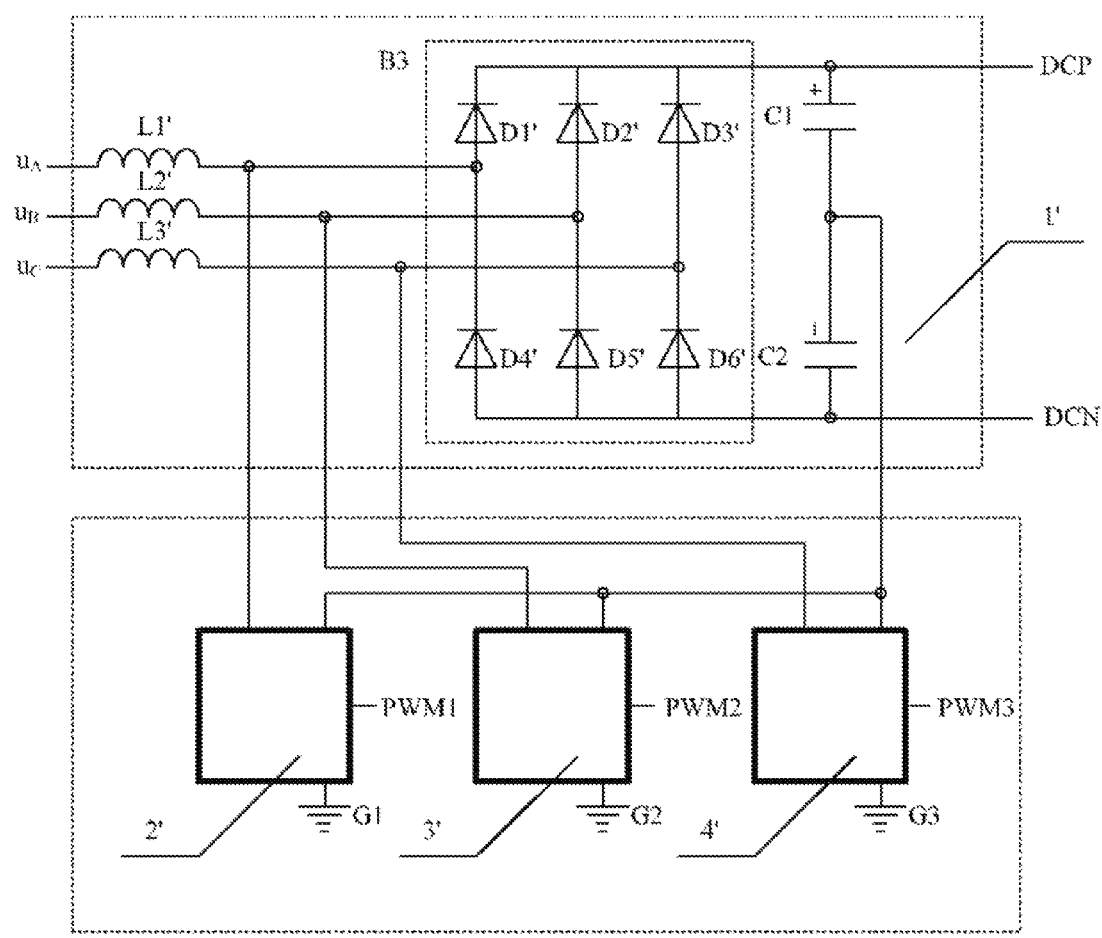
FIG. 3 is a circuit configuration diagram of a bootstrap driving circuit without an extra power supply for a three-phase power supply system of the second embodiment.

The embodiment provides a bootstrap driving circuit without an extra power supply, as shown in FIG. 3, including a power unit 1' and a switching bootstrap drive unit 2', a switching bootstrap drive unit 3', a switching bootstrap drive unit 4', wherein the switching bootstrap drive unit is a general term of a switching unit, a bootstrap unit and a drive unit.

As shown in FIG. 3, the distinctions of the embodiment from the first embodiment are: the power unit includes boost inductors L1', L2', L3', a third bridge rectifier circuit B3, voltage stabilizing capacitors C1, C2; the third bridge rectifier circuit includes diodes D1', D2', D3', D4', D5', D6', wherein the diodes D1' and D4' are in series to form a first series circuit, the diodes D2' and D5' are in series to form a second series circuit, the diodes D3' and D6' are in series to form a third series circuit. The first series circuit, the second series circuit and the third series circuit are in parallel to form the third bridge rectifier circuit; the boost inductor L1' is connected with the anode of the diode D1' and the cathode of the diode D4, the boost inductor L2' is connected with the anode of the diode D2' and the cathode of the diode D5, the boost inductor L3' is connected with the anode of the diode D3' and the cathode of the diode D6. The voltage stabilizing capacitors C1, C2 being in series is connected in parallel with the third bridge rectifier circuit, the anode end of the diode D1' is the first output end of the power device, the anode end of the diode D2' is the second output end of the power device, the anode end of the diode D3' is the third output end of the power device, the cathode end of the diode D1' is the fourth output end of the power device, the anode end of the diode D4' is the fifth output end of the power device, the anode end of the voltage stabilizing capacitor C2 is the sixth output end of the power device. The first and sixth output ends of the power unit 1' are connected with the input end of the switching bootstrap drive unit 2'; the second and sixth output ends of the power unit 1' are connected with the input end of the switching bootstrap drive unit 3', the third and sixth output ends of the power unit 1' are connected with the input end of the switching bootstrap drive unit 4'.

One power unit 1' of the embodiment may be equipped with three switching bootstrap drive units, thereby achieving the bootstrap drive of the three-phase circuit. Similarly, it can be inferred that the invention may be further applicable in multi-phase circuit with bootstrap drive.

The embodiment has a further improvement than the bootstrap driving circuit without an extra power supply of the first embodiment, and belongs to a three-phase bootstrap driving circuit without an extra power supply. The embodiment is suitable for the three-phase partial active PFC, which is deemed consisting of three single-phase bootstrap driving circuits without an extra power supply with the same structure.

The embodiment is capable for achieving the three-phase bootstrap driving circuit of the power device without an extra power supply, such that the bootstrap driving circuit has much wider range of applications.

The present invention employs a circuit consisting of a power unit, a switching unit, a bootstrap unit and a drive unit, the power unit electricizes the bootstrap unit as the power switch turns off, and opens the power switch due to its energy release, which avoids extra power circuit, and takes full advantage of the energy of the power unit; meanwhile, the whole circuit is comparatively simple with less required devices, and has good topological property, and is flexible to apply in the drive of the power device in the three-phase circuit, and achieves innovation in the technical field of the bootstrap driving circuit.

Therefore, the present invention effectively overcomes the shortcomings of the prior art and has a high industrial application value.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:
1. A bootstrap driving circuit without an extra power supply, characterized in that, the bootstrap driving circuit without extra power supply comprising:
   a power unit used to output a direct voltage;
   a switching unit connected with the power unit, to control the turn-on or turn-off with the power unit;
   a bootstrap unit connected with the switching unit, to supply drive electric energy and output drive power; the bootstrap unit comprises an energy storage capacitor;

a drive unit connected with the bootstrap unit, to output control signal under the drive of the drive power;

the drive unit comprises a photoelectric coupler, the photoelectric coupler comprises a power side of a power device and a control side of a control device, the power side of the power device receives the drive of the drive power, the control side of the control device outputs the control signal;

the switching unit comprises a second bridge rectifier circuit and a power device; the second bridge rectifier circuit is connected in parallel with the power device; the gate pole of the power device is connected with the power side of the power device of the drive unit, to receive the drive power.

2. The bootstrap driving circuit without an extra power supply according to claim 1, characterized in that: the bootstrap unit comprises an energy storage capacitor C3, a voltage stabilizing diode WD1, a diode D1, wherein the energy storage capacitor C3 is connected in series with the diode D1, the voltage stabilizing diode WD1 is connected in parallel with the energy storage capacitor C3.

3. The bootstrap driving circuit without an extra power supply according to claim 2, characterized in that: the bootstrap unit further comprises a resistor R4, the resistor R4 is connected in series between the diode D1 and the energy storage capacitor C3.

4. The bootstrap driving circuit without an extra power supply according to claim 1, characterized in that: the power unit comprises an inductor L1, a first bridge rectifier circuit, voltage stabilizing capacitors C1, C2; the inductor L1 is connected with the first bridge rectifier circuit, the voltage stabilizing capacitors C1, C2 being in series is connected in parallel with the first bridge rectifier circuit; the first bridge rectifier circuit comprises diodes D3, D4, D5, D6, wherein the diodes D3 and D4 are in series to form a first series circuit, the diodes D5 and D6 are in series to form a second series circuit; the first series circuit and the second series circuit are in parallel to form the first bridge rectifier circuit; a cathode of the diode D3 and a cathode end of the diode D5 are a first output end of the power unit, an anode of the diode D4 and an anode end of the diode D6 are a second output end of the power unit, a positive pole of the voltage stabilizing capacitor C2 and a negative leading-out terminal of C1 are a third output end of the power unit.

5. The bootstrap driving circuit without an extra power supply according to claim 1, characterized in that: the power unit comprises inductors L1', L2', L3', a third bridge rectifier circuit, voltage stabilizing capacitors C1', C2'; the third bridge rectifier circuit comprises diodes D1', D2', D3', D4', D5', D6', wherein the diode D1' and the diode D4' are in series to form a first series circuit, the diode D2' and the diode D5' are in series to form a second series circuit, the diode D3' and the diode D6' are in series to form a third series circuit; the first series circuit, the second series circuit and the third series circuit are in parallel to form the third bridge rectifier circuit; the inductor L1' is connected with an anode of the diode D1', the inductor L2' is connected with an anode of the diode D2', the inductor L3' is connected with an anode of the diode D3', the voltage stabilizing capacitors C1', C2' being in series is connected in parallel with the third bridge rectifier circuit, a positive pole of the voltage stabilizing capacitor C1' is connected with a cathode of the diode D3', a negative pole of the voltage stabilizing capacitor C2' is connected with an anode of the diode D6'; an anode end of the diode D1' is a first output end of the power unit, an anode end of the diode D2' is a second output end of the power unit, a anode end of the diode D3' is a third output end of the power unit, a cathode end of the diode D1' is a fourth output end of the power unit, an anode end of the diode D4' is a fifth output end of the power unit, a positive leading-out terminal of the voltage stabilizing capacitor C2' is a sixth output end of the power unit.

* * * * *